United States Patent [19]

Kano et al.

[11] 3,786,320

[45] *Jan. 15, 1974

[54] SCHOTTKY BARRIER PRESSURE SENSITIVE SEMICONDUCTOR DEVICE WITH AIR SPACE AROUND PERIPHERY OF METAL-SEMICONDUCTOR JUNCTION

[75] Inventors: Gota Kano, Kyoto; Shohei Fujiwara, Takatsuki-shi; Mutsuo Iizuka, Osaka; Hiromasa Hasegawa, Takatsuki-shi; Tsukasa Sawaki, Toyonaka-shi, all of Japan

[73] Assignee: Matsushita Electronics Corporation, Oaza Kadoma, Kadoma-shi, Osaka, Japan

[ * ] Notice: The portion of the term of this patent subsequent to Oct. 2, 1990, has been disclaimed.

[22] Filed: Sept. 29, 1969

[21] Appl. No.: 861,647

[30] Foreign Application Priority Data

Oct. 4, 1968 Japan .............................. 43/72667

[52] U.S. Cl. . 317/235 R, 317/235 M, 317/235 UA, 317/235 AJ

[51] Int. Cl. ......................... H01l 11/00, H01l 15/00

[58] Field of Search ...................... 317/234, 235, 26, 317/31, 46.1, 24, 39, 47

[56] References Cited

UNITED STATES PATENTS

| | | | |
|---|---|---|---|
| 3,322,581 | 5/1967 | Hendrickson et al. | 317/235 |
| 3,443,041 | 5/1969 | Kahng et al. | 317/234 |
| 3,514,346 | 5/1970 | Cray | 317/235 |
| 3,585,469 | 6/1971 | Jager | 317/234 |
| 3,280,391 | 10/1966 | Bittmann et al. | 317/235 |
| 3,518,508 | 6/1970 | Yamashita et al. | 317/235 |
| 3,087,099 | 4/1963 | Lehovec | 317/235 |
| 3,424,627 | 1/1969 | Michel et al. | 317/235 |
| 3,443,041 | 5/1969 | Kahng et al. | 317/235 |
| 3,513,366 | 5/1970 | Clark | 317/235 |

FOREIGN PATENTS OR APPLICATIONS

| | | | |
|---|---|---|---|
| 1,433,160 | 2/1966 | France | 317/235 |

OTHER PUBLICATIONS

IBM Technical Disclosure Bulletin, "Schottky Barrier Diode," by Stiles, Vol. 11, No. 1 June, 1968, page 20.

*Primary Examiner*—John W. Huckert
*Assistant Examiner*—Andrew J. James
*Attorney*—Paul M. Craig, Jr. and Charles E. Wands

[57] ABSTRACT

Disclosed is a pressure-sensitive transistor whose emitter or collector junction is formed by use of a Schottky barrier junction and wherein the current through the transistor changes in accordance with the applied pressure when pressure is applied to said junction by pressure applying means. Such a transistor is advantageous in that a high pressure-to-current conversion factor is obtained, little noise is generated at the junction, and the reverse leakage current appearing at the junction is extremely small.

11 Claims, 4 Drawing Figures

G. KANO
M. IIZUKA
S. FUJIWARA
H. HASEGAWA
&
T. SAWAKI
INVENTORS

BY [signature]

ATTORNEY

SCHOTTKY BARRIER PRESSURE SENSITIVE SEMICONDUCTOR DEVICE WITH AIR SPACE AROUND PERIPHERY OF METAL-SEMICONDUCTOR JUNCTION

This invention relates to a Schottky barrier junction type pressure-sensitive transistor and more particularly to a device wherein a metal-semiconductor barrier junction or a so-called Schottky type barrier junction is used for an emitter or collector junction of a transistor. Mechanical pressure applied from outside to the junction causes a change to an electrical signal on the output side in correspondence with the applied pressure.

Figure 1:
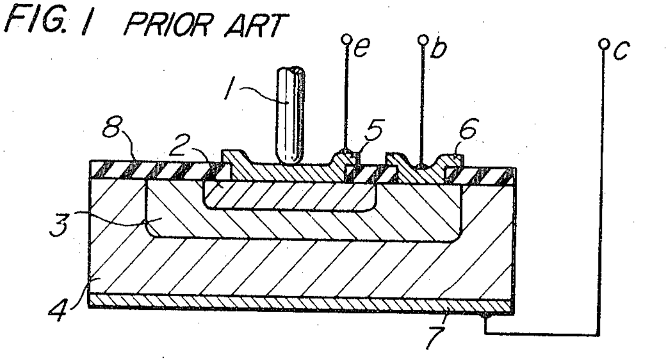
FIG. 1 PRIOR ART

There has conventionally been known a device as shown in FIG. 1, in which mechanical pressure is applied vertically to an emitter junction of a conventional p-n-p or n-p-n transistor by a pressure applying stylus 1 to change the resistance value of a p-n junction between an emitter region 2 and a base region 3, thereby changing the current due to minority carriers running through said junction and the collector current is changed drastically in correspondence with the said mechanical pressure by the current amplification effect between the base region 3 and the collector region 4. In the same figure, 5, 6 and 7 denote emitter, base and collector electrode films, respectively, and 8 indicates an insulating film.

In the device described hereinabove, however, since the emitter junction is formed deeply in the surface part by the diffusion method, the mechanical pressure applied to said emitter junction is remarkably attenuated in a thickness direction of the emitter region 2 and sensitivity to the external pressure is lowered. Moreover, since force is applied repeatedly to the junction, crystallographic dislocations in the emitter region 2 reduce the reliability. Further, it has been practically difficult to control the depth of the junction.

An object of this invention is to provide a pressure-sensitive transistor having an improved pressure sensitivity and reliability.

Another object of the invention is to provide a pressure-sensitive device stable in quality and easy to fabricate.

In order to achieve these objects, a pressure-sensitive transistor according to this invention is characterized in that an emitter or collector junction is formed by use of a rectifying junction composed of a metal-semiconductor junction and mechanical pressure is applied to the thin metal film. This invention is further characterized in that said junction is formed at the contact part of the hollow base of the substrate formed by etching through a window of the insulating layer provided on the substrate surface and the metal film formed by evaporation through said window of the insulating layer and that there is formed on the periphery of said junction a gap surrounded by said insulating layer, said metal film and said hollow base of the semiconductor.

Figure 2:
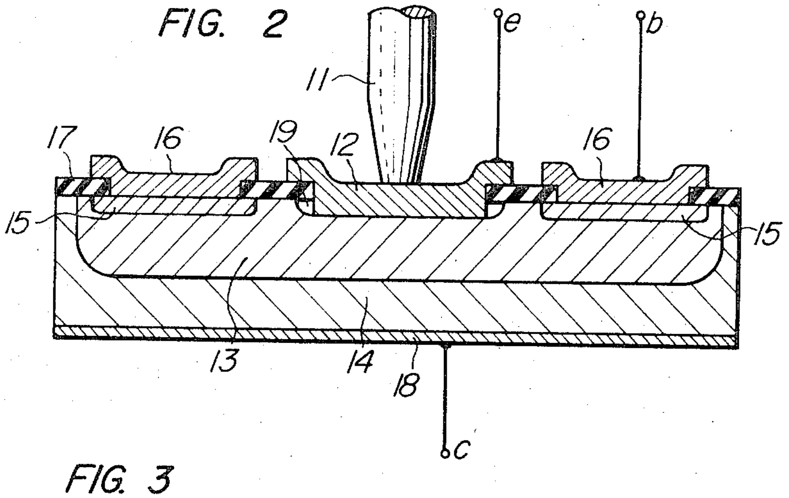
Figure 3:
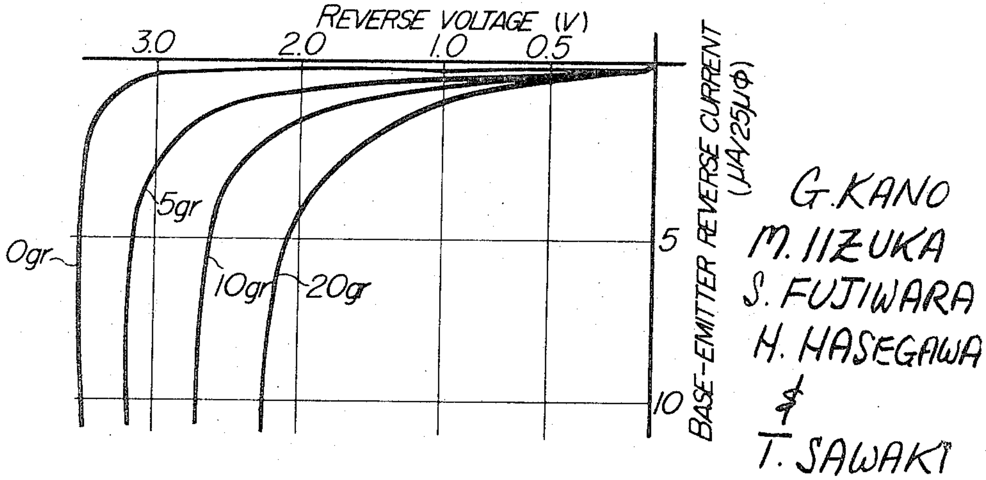
Figure 4:
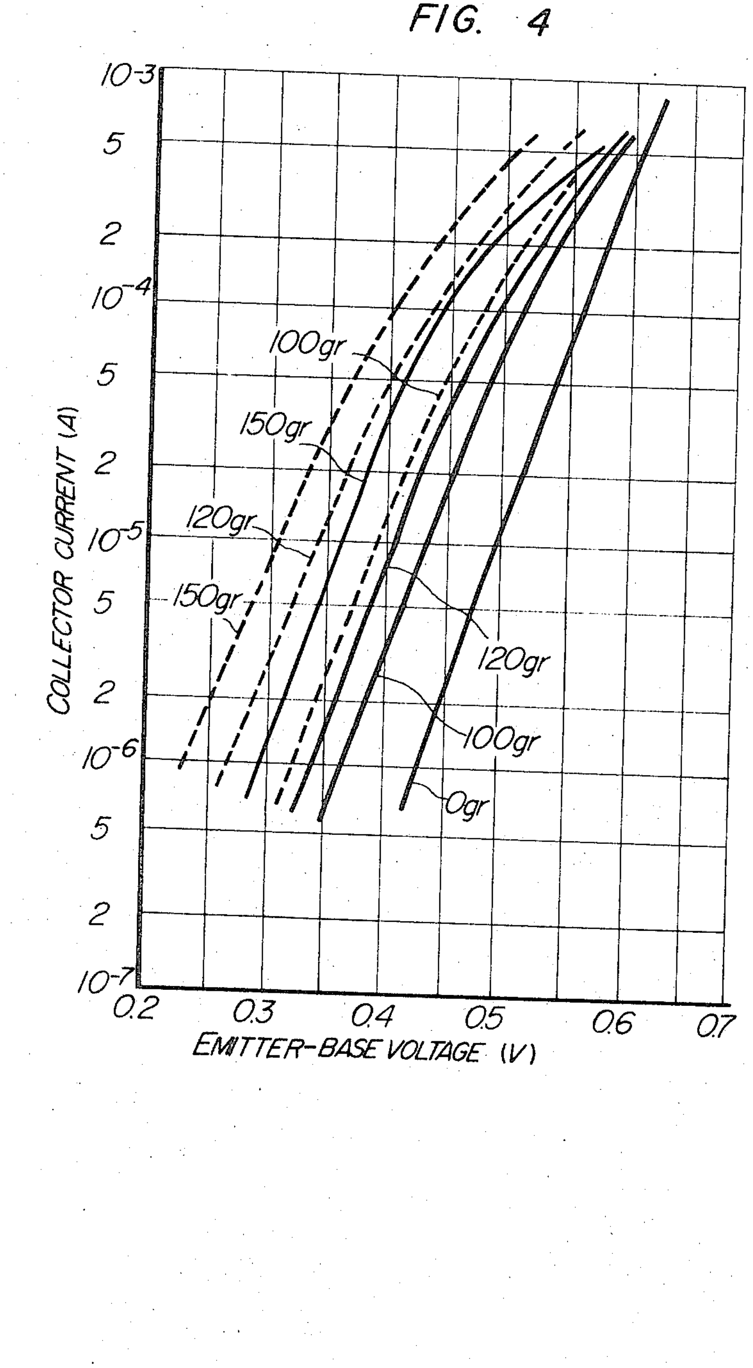

Other objects, features and advantages of this invention will become more apparent from the following detailed description of the invention when taken in conjunction with the accompanying drawings, in which FIG. 1 is a schematic sectional diagram showing a conventional pressure-sensitive transistor having a p-n junction, FIG. 2 is a sectional diagram showing a pressure-sensitive transistor according to an embodiment of this invention, FIG. 3 is a diagram showing one characteristic of an embodiment of this invention, and FIG. 4 is a diagram showing the other characteristics of an embodiment of this invention in comparison with those of the conventional device.

Referring to FIG. 2 which shows a schematic sectional diagram of a pressure-sensitive transistor according to an embodiment of this invention, 11 denotes a rigid-body pressure applying stylus which is a part of means for applying mechanical pressure, 12 denotes a metal film, e.g., a molybdenum evaporated film which forms an emitter junction in the transistor of this embodiment, 13 denotes a base region of the transistor usually formed on a substrate semiconductor 14 by diffusion or epitaxial growth, 15 denotes a high concentration of a diffused region having the same conductivity type as the base region 13 and forming ohmic contact with the electrode metal 16, 17 indicates an insulating film, e.g., a $SiO_2$ film, and 18 indicates an electrode metal when the substrate 14 is made into a collector region.

On the periphery of the emitter junction or the junction between said metal film 12 and the base region 13, there is provided a gap 19 surrounded by the insulating layer 17, the metal film 12 and the hollow side surface of the base substrate 13. The gap 19 is formed in the following way. The base region 13 in the substrate is first chemically etched deeply through the junction window provided in the insulating film 17 to form a hollow in said region and the insulating film immediately under the said junction window is scraped. The substrate is etched laterally in addition, and a metal film 12 of several thousand angstroms is deposited on said hollow part through said window. According to experience, when the depth of the hollow is about 3,000 A, the hollow is etched laterally by about 1,000 A, thus obtaining the desired gap.

The gap shields the base region even when a charge accumulation layer is present immediately under the insulating film on the surface of the base region. Thus, a reverse leakage current between the base and the emitter is substantially eliminated. This fact remarkably improves the defect that a rather small emitter breakdown voltage is obtained in a device according to the prior art.

Further, in a forward direction, noise generated by surface recombination at the end part of the junction etc. is also inhibited. In FIG. 3, there is shown a reverse base-emitter rectifying characteristic of a device according to this invention using the value of applied pressure as a parameter.

FIG. 4 shows the operation characteristics of a device according to this invention, in which solid curves represent a device according to the prior art and dashed curves represent a device of this invention.

The parameters shown in FIGS. 3 and 4 represent mechanical pressure applied to the pressure applying stylus whose top has a radius of curvature of several tons of microns.

Though a pressure-sensitive transistor, wherein a metal-semiconductor Schottky barrier is used for an emitter junction, has been described in the above explanation of the embodiment of this invention, it will be easily understood from the principle of operation of such transistors that the Schottky barrier may be used for a collector junction as well. It has been found by the present inventors that a device, wherein the Schottky barrier is used for a collector junction and a gap as explained hereinabove is provided, has a collector breakdown voltage more than twice as great as that of the conventional device. Thus, a Schottky barrier collector pressure-sensitive transistor may be put to practical use.

As has been fully described hereinabove, since a Schottky barrier is used for an emitter or collector junction of a transistor in the device according to this invention, the distance from the surface to the junction part is determined solely by the thickness of the metal film. Thus, when mechanical pressure is applied by external means, e.g., a rigid-body pressure applying stylus, the pressure-to-current conversion factor is remarkably improved compared with the conventional p-n junction type transistor. Further, since the metal film can be formed by vacuum evaporation or sputtering, the control of the thickness is easier than the techniques used in forming a conventional device and the reproducibility is also enhanced.

Since a Schottky barrier forming an emitter or collector junction of the pressure-sensitive transistor of this invention is provided on the base surface of the substrate hollow which is deeply chemically etched through a junction window formed in the insulating layer on the substrate surface, and a predetermined gap is provided on the periphery of said junction, the reverse impedance is also enhanced.

What is claimed is:

1. A pressure sensitive semiconductor device including four adjacent layers, three of which have two respective junctions therebetween and capable of transistor action, one of said outer layers being a metal layer forming a metal-semiconductor junction with an adjacent first semiconductor layer, and the other of said outer layers being a metal layer in ohmic contact with an adjacent second semiconductor layer, said first and second semiconductor layers forming a semiconductor—semiconductor junction therebetween, and means for applying pressure to said metal-semiconductor junction, wherein said metal-semiconductor junction is formed along the wall of a recess formed in said first semiconductor layer and said first semiconductor layer is provided with a closed space void of solid material at its periphery, said space extending to the base of said recess in said first semiconductor layer at the location where said metal -semiconductor junction is formed and being surrounded by the wall of said recess, said one outer metal layer and an insulating layer being provided on the exposed surface of said first semiconductor layer.

2. A device according to claim 1, wherein the depth of said recess is at least 3,000 A, the lateral extension of said space is at least 1,000 A, and the thickness of said one outer metal layer is larger than the depth of said recess.

3. A transistor comprising:

a semiconductor substrate having a recess formed in its major surface, an insulating film covering said major surface of said semiconductor substrate and having an opening therethrough exposing a major part of the bottom of said recess, said opening being disposed above said recess, the cross-sectional area of said opening being less than the cross-sectional area of said recess, so as to provide a separation space in said semiconductor substrate extending around the portion of the recess located underneath the insulating film, a Schottky barrier formed at the bottom of said recess including an emitter electrode layer covering the opening in said insulating film and extending through said opening onto the bottom of said recess while leaving said separation space substantially vacant, said separation space extending to the base of said recess in said semiconductor substrate at the location where said Schottky barrier is formed, so that said Schottky barrier is surrounded by the separation space extending around the recess, and at least one base electrode layer, deposited through a hole opened through the insulating film and located on the same side of said substrate as said emitter electrode layer so as to make ohmic contact with the substrate, and including means for applying pressure to said Schottky barrier.

4. A transistor according to claim 3, wherein the width of said separation space is at least 1,000 A.

5. A transistor according to claim 3, wherein the insulating film is made of silicon dioxide, and the emitter electrode layer is a molybdenum film.

6. A transistor according to claim 3, further including a collector electrode layer formed on said substrate on the side thereof opposite to the side on which said emitter layer is formed.

7. A Schottky barrier type transistor comprising:

a semiconductor substrate having a recess formed in a base region thereof, an insulating film covering a major surface portion of said semiconductor substrate and having an opening therethrough exposing a major part of the bottom of said recess, said opening being disposed above said recess, the cross-sectional area of said opening being less than the cross-sectional area of said recess, so as to provide a separation space in said semiconductor substrate extending around the recess and located underneath the insulating film, A Schottky barrier formed at the bottom of said recess including a first metal layer covering the opening in said insulating film and extending through said opening onto thebottom of said recess and the surrounding insulating film while leaving said separation space substantially vacant, said separation space extending to the base of said recess in said semiconductor substrate at the location where said Schottky barrier is formed, so that said Schottky barrier is surrounded by the separation space extending around the recess, another metal layer deposited through a hole opened through the insulating film, so as to make ohmic contact with the base region, a further metal layer deposited on the part other than the base region of the substrate, so as to make ohmic contact therewith, and means for applying pressure to said Schottky barrier.

8. A transistor according to claim 7, wherein the width of said separation space is at least 1,000 A.

9. A transistor according to claim 7, wherein the insulating film is made of silicon dioxide, and the first metal layer is a molybdenum film.

10. A transistor according to claim 3, wherein said pressure applying means comprises a pressure applying stylus contacting said first layer.

11. A transistor according to claim 7, wherein said pressure applying means comprises a stylus contacting said first metal layer.

* * * * *